United States Patent
Gudeman et al.

(10) Patent No.: US 11,309,837 B2
(45) Date of Patent: Apr. 19, 2022

(54) RESONANT FILTER USING MM WAVE CAVITY

(71) Applicant: Innovative Micro Technology, Goleta, CA (US)

(72) Inventors: Christopher S. Gudeman, Lompoc, CA (US); Abbas Abbaspour Tamijani, San Diego, CA (US)

(73) Assignee: Innovative Micro Technology, Goleta, CA (US)

( * ) Notice: Subject to any disclaimer, the term of this patent is extended or adjusted under 35 U.S.C. 154(b) by 0 days.

(21) Appl. No.: 17/035,896

(22) Filed: Sep. 29, 2020

(65) Prior Publication Data
US 2021/0083625 A1  Mar. 18, 2021

Related U.S. Application Data

(63) Continuation of application No. 16/104,146, filed on Aug. 17, 2018, now Pat. No. 10,804,850.

(60) Provisional application No. 62/550,569, filed on Aug. 26, 2017.

(51) Int. Cl.
| | |
|---|---|
| *H03B 9/14* | (2006.01) |
| *H01L 47/02* | (2006.01) |
| *H03B 7/14* | (2006.01) |
| *G01H 13/00* | (2006.01) |
| *H03B 5/18* | (2006.01) |
| *H03B 7/06* | (2006.01) |
| *G01N 22/00* | (2006.01) |
| *H03B 9/12* | (2006.01) |

(52) U.S. Cl.
CPC ............ *H03B 9/145* (2013.01); *G01H 13/00* (2013.01); *G01N 22/00* (2013.01); *H01L 47/026* (2013.01); *H03B 5/1823* (2013.01); *H03B 7/06* (2013.01); *H03B 7/14* (2013.01); *H03B 2009/123* (2013.01); *H03B 2009/126* (2013.01); *H03B 2200/0032* (2013.01)

(58) Field of Classification Search
CPC ........ H03B 9/145; H03B 7/14; H03B 5/1823; H03B 7/06; H03B 2200/0032; H03B 2009/126; H03B 2009/123; G01N 22/00; H01L 47/026; G01H 13/00
USPC ......................................................... 73/24.02
See application file for complete search history.

(56) References Cited

U.S. PATENT DOCUMENTS

| | | | | |
|---|---|---|---|---|
| 5,365,243 A | * | 11/1994 | Buehler | H01Q 1/3275 |
| | | | | 333/247 |
| 5,514,337 A | * | 5/1996 | Groger | G01N 27/023 |
| | | | | 324/207.15 |
| 7,068,121 B2 | * | 6/2006 | Ding | H01P 5/08 |
| | | | | 333/21 R |

(Continued)

OTHER PUBLICATIONS

Memon et al., "Millimeter-Wave Chemical Sensor Using Substrate-Integrated-Waveguid Cavity", Sensors 2016, 16, 1829 (Year: 2016).*

Primary Examiner — Nathaniel T Woodward
(74) Attorney, Agent, or Firm — Jaquelin K. Spong

(57) ABSTRACT

Systems and methods for forming a mm wave resonant filter include a lithographically fabricated high Q resonant structure. The resonant structure may include a plurality of cavities, each cavity having a characteristic frequency that defines its passband. A filter may include a plurality of resonant structures, and each resonant structure may include a plurality of cavities. These cavities and filters may be fabricated lithographically.

13 Claims, 11 Drawing Sheets

(56) References Cited

U.S. PATENT DOCUMENTS

| | | | | |
|---|---|---|---|---|
| 7,526,970 | B2* | 5/2009 | Mawer | G01N 27/622 |
| | | | | 73/866 |
| 8,230,564 | B1* | 7/2012 | Reid, Jr. | H01P 11/007 |
| | | | | 29/25.42 |
| 8,606,531 | B2* | 12/2013 | Pinguet | G01N 35/08 |
| | | | | 702/24 |
| 9,032,782 | B1* | 5/2015 | Van Deusen | G01N 29/022 |
| | | | | 73/61.45 |
| 9,958,330 | B2* | 5/2018 | Koyama | A61B 5/0507 |
| 2009/0140751 | A1* | 6/2009 | Takeuchi | G01B 15/02 |
| | | | | 324/635 |
| 2010/0321191 | A1* | 12/2010 | Gong | G01K 1/024 |
| | | | | 340/584 |
| 2011/0063054 | A1* | 3/2011 | Mendis | H01P 7/06 |
| | | | | 333/230 |
| 2011/0152725 | A1* | 6/2011 | Demir | A61B 5/103 |
| | | | | 600/587 |
| 2011/0253897 | A1* | 10/2011 | Saeedkia | G01N 21/3581 |
| | | | | 250/358.1 |
| 2013/0135264 | A1* | 5/2013 | Black | H03H 9/173 |
| | | | | 345/204 |
| 2014/0292305 | A1* | 10/2014 | Fuse | G01R 23/165 |
| | | | | 324/76.23 |
| 2015/0028889 | A1* | 1/2015 | Gong | G01K 7/24 |
| | | | | 324/633 |
| 2016/0258807 | A1* | 9/2016 | Pein | G01J 5/046 |
| 2019/0173153 | A1* | 6/2019 | Gudeman | H01P 1/2088 |
| 2020/0066661 | A1* | 2/2020 | Tschumakow | H01L 23/66 |

\* cited by examiner

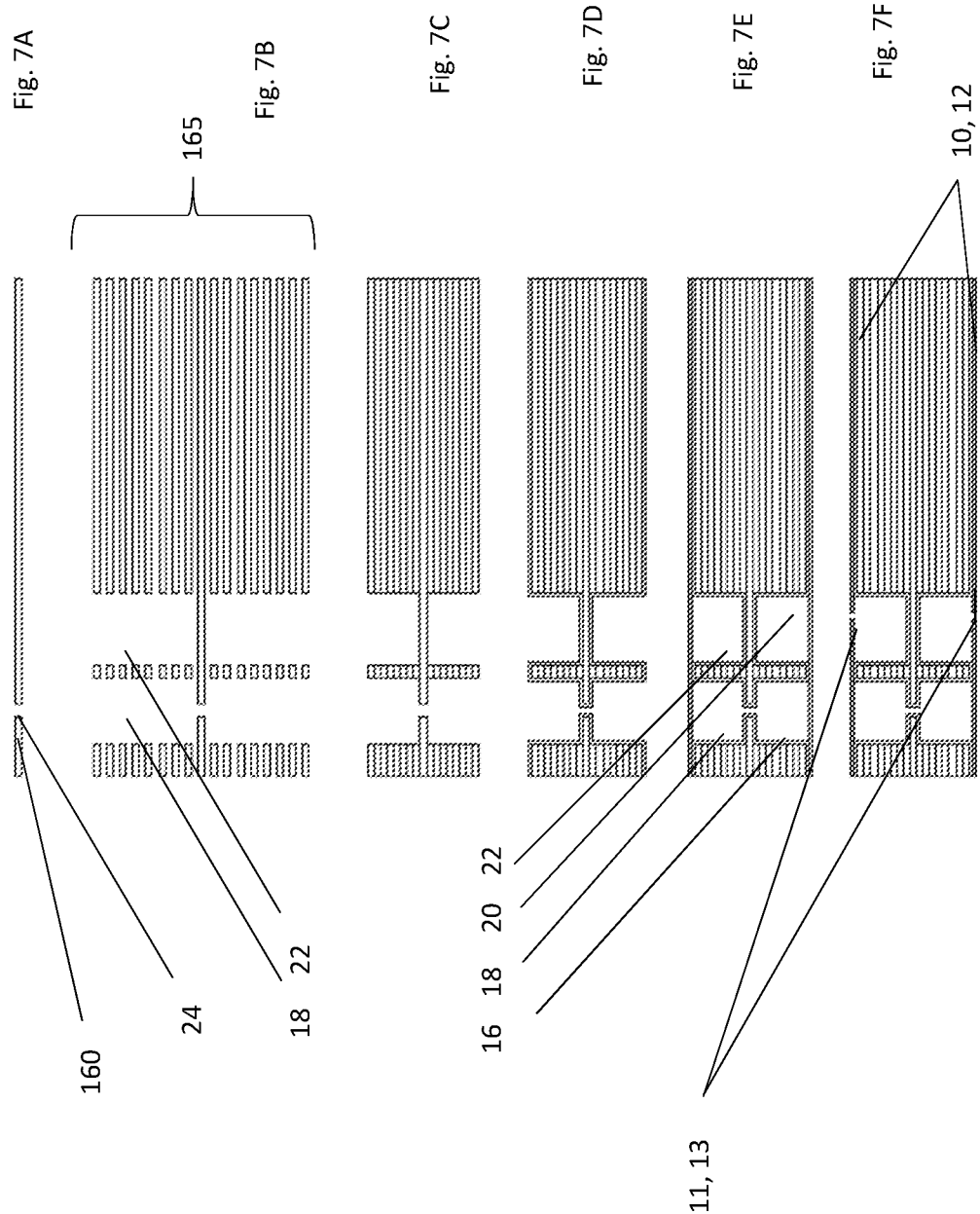

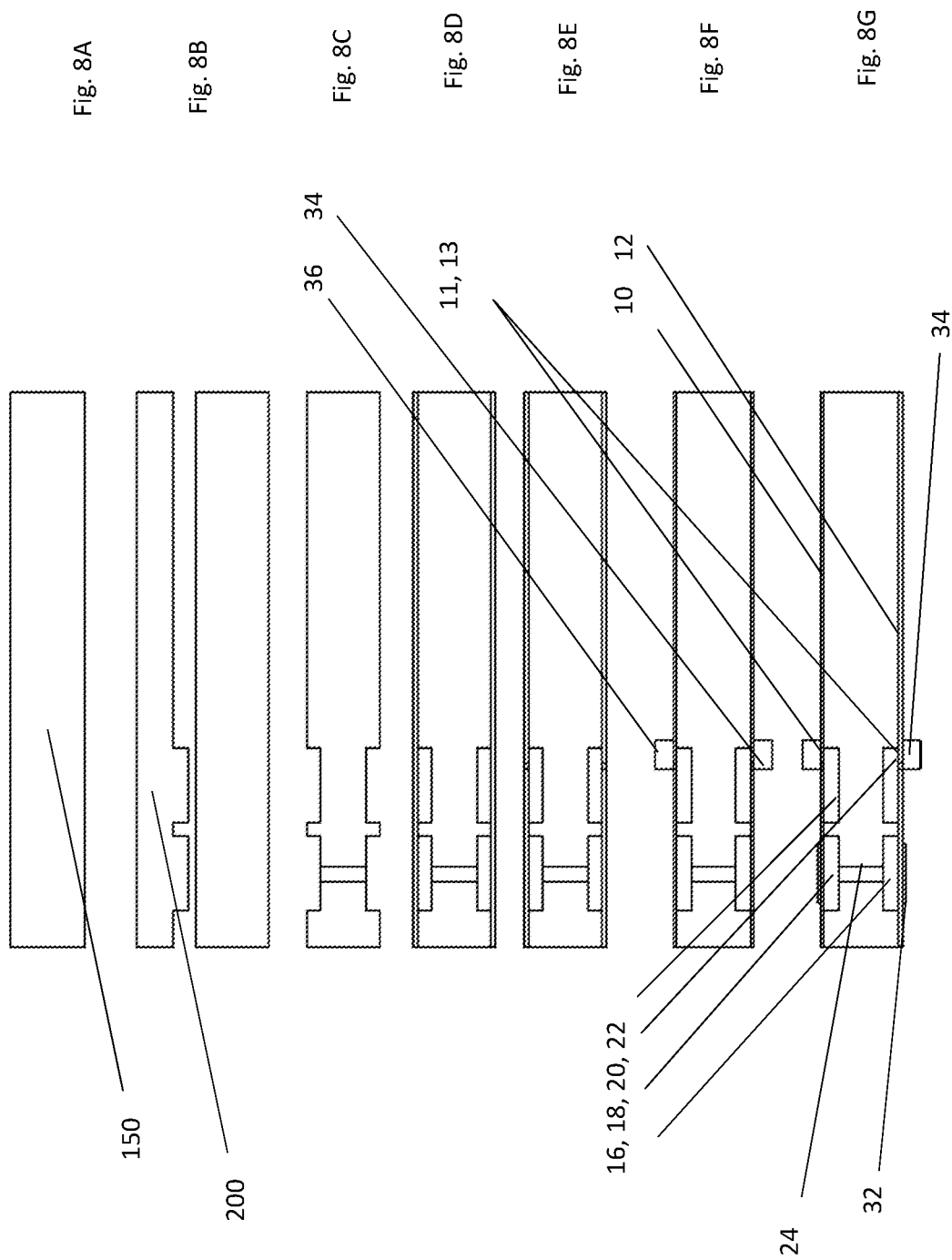

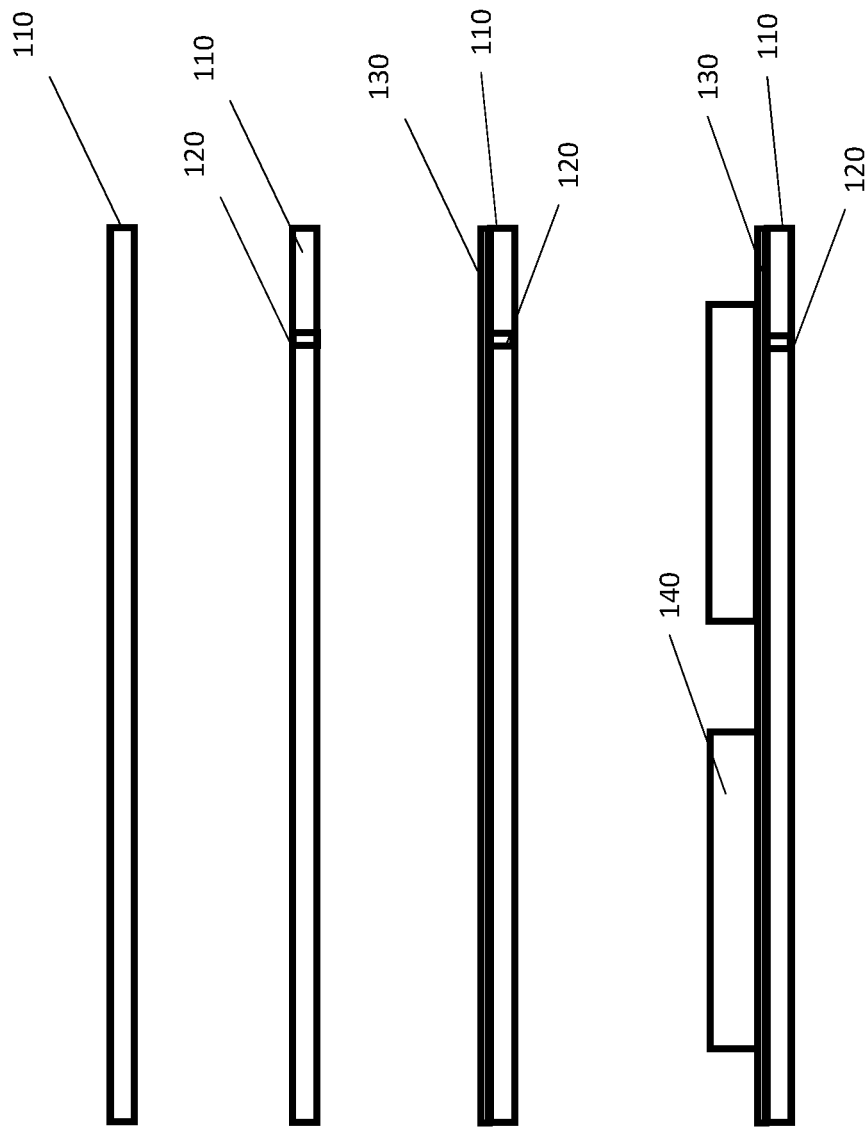

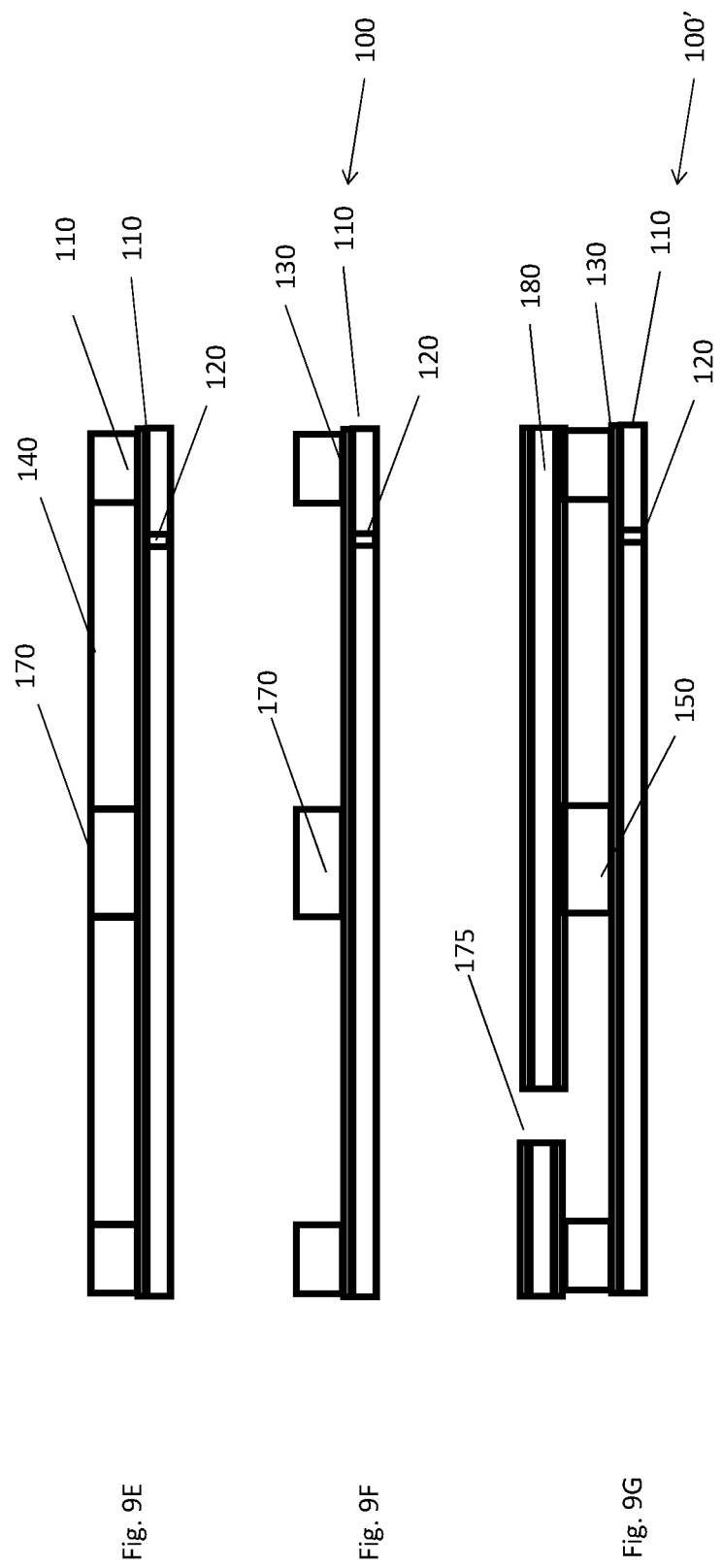

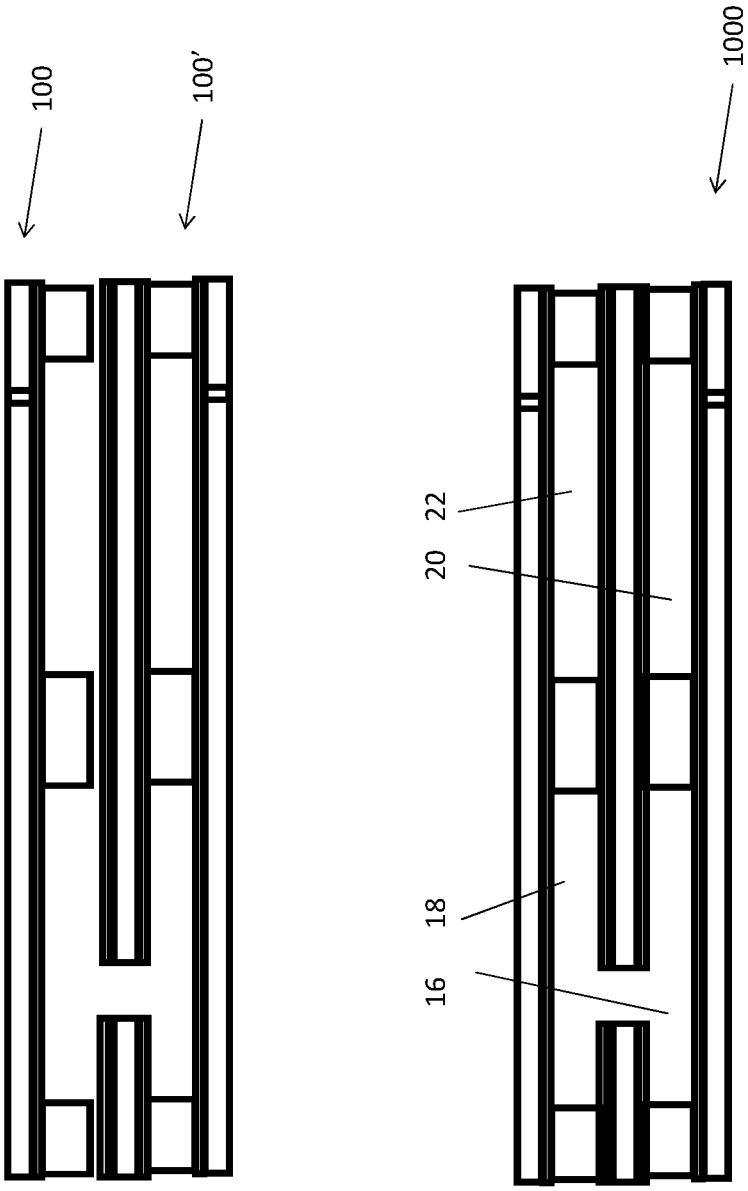

RESONANT FILTER USING MM WAVE CAVITY

CROSS REFERENCE TO RELATED APPLICATIONS

This nonprovisional US Patent Application is a divisional and claims priority to U.S. non-Provisional patent application Ser. No. 16/104,146 filed Aug. 17, 2018, which in turn claims priority to U.S. Provisional Patent Application Ser. No. 62/550,569 filed Aug. 25, 2017. Each of these prior applications is incorporated by reference in their entireties.

STATEMENT REGARDING FEDERALLY SPONSORED RESEARCH

Not applicable.

STATEMENT REGARDING MICROFICHE APPENDIX

Not applicable.

BACKGROUND

This invention relates to a resonant microwave cavity for use in mobile applications and gas sensing devices.

The sensing of contaminant gases and mobile wireless communication may both make use of rather long, mm wavelength electromagnetic radiation. Contaminant gas molecules may absorb in the infrared as their transition frequencies may lie in this range. Communications devices may also use this spectrum because many physical barriers such as walls and ceilings may be transparent in this wavelength range.

Gas sensors require high sensitivity and high specificity, two factors that are often in opposition, since a very sensitive system will likely be sensitive to many gases. But high sensitivity is extremely important, because small quantities of some compounds in the air can be toxic or fatal. For example, exposure to 1 part per million of CO in the atmosphere will cause headaches in 10 minutes and irreversible brain damage 60 minutes. Chemical receptor systems that provide very high sensitivity to CO, often have a low level sensitivity to $CO_2$, which is far more abundant. Thus, distinguishing between harmful and benign gases is a problem. Chemical receptor systems can become contaminated, which causes a loss in sensitivity and consequent risk to personnel.

Prior art gas sensors fall into several categories.
1) Chemical receptor for specific capture of the target molecule
2) Resonant beam structures to determine the mass of the molecule
3) Sensors that combust the target species and measure its exothermicity
4) Chemical Field Effect Transistors (Chem-FET)
5) Combinations of the above.

All of these to some extent share the following drawbacks
1) Contamination
2) Probable false readings (inaccuracy)
3) Low sensitivity
4) Low specificity Mm wave RF radiation, in theory could be used to probe molecular energy levels of contaminant gases, and so could be used to detect their presence. However, absorption spectroscopy using mm wave RF radiation in general requires very small structures and a tunable source.

Advances in mm wave RF filter technology have also enabled high bandwidth and thus high data rates in wireless communication. In these technologies, surface acoustic wave (SAW) filters and bulk acoustic wave (BAW) filters, provide very high Q and lithographic center frequency targeting, which are ideal for today's mobile device applications. As frequencies push higher for future needs of increased bandwidth and data rates, these devices will need to be reduced in size to the point where they are no longer manufacturable.

The list of frequencies employed by mobile devices is quite extensive, but generally 3G and 4G bands range from 700 MHz to 2 GHz. The corresponding wave length ($l_{vac}$) of electromagnetic radiation in vacuum or air is 15 cm to 40 cm.

Because the characteristic wavelength of this radiation ($l_{vac}/2$) is much bigger than the size of a mobile handset, cavity filters cannot be used in mobile phone handsets. Prior art has solved this problem by using SAW and BAW technologies, which convert the electromagnetic energy into acoustic energy in a piezo-electric material such as lithium tantalate ($LiTaO3$) or aluminum nitride (AlN). The acoustic energy then propagates in the piezo-electric material at the speed of sound in that solid. Because the speed of sound (4 km/sec) is $\sim 1 \times 10^5$ lower than the speed of light ($3 \times 10^5$ km/sec), the wavelength of the acoustic energy ($l_{sonic}$=2 um) is much shorter than that of the electromagnetic radiation ($l_{vac}$=15 cm). Therefore a resonant device can be much smaller and can easily fit onto a lithographically defined chip that can be deployed in mobile phone handset.

New bands are being pursued at millimeter wavelengths (mmWave), corresponding to frequencies of 28 GHz and 77 GHz. Here $l_{vac}$ (wavelength of the radiation in vacuum) is 1 cm and 0.4 cm respectively, while $l_{sonic}$ (the wavelength of the radiation in the solid) is 140 nm and 65 nm, respectively. While these $l_{sonic}$ dimensions are achievable with the most modern lithographic fabrication methods, the cost of these fabrication methods are unacceptable in the competitive mobile handset marketplace. Furthermore, power loading in these filters can be substantial, thus requiring thick metallization layers to launch the signals into the piezo-electric material. As the wavelength decreases, the line width of the metal layers must also decrease, which drive the thickness even higher. State of the art lithographic methods mandate usage of only very thin films.

Accordingly, a new technology is needed for sensing these dangerous compounds in homes, offices and industrial settings, as well as for mobile devices. Ideally this technology is small, inexpensive, robust and highly sensitive. For mobile devices, an alternative to SAW and BAW filters is needed to reduce cost and complexity, as well as power consumption which is a critical figure of merit for portable, mobile devices.

SUMMARY

The technology described here uses a photolithographically fabricated cavity resonant structure that can be manufactured inexpensively with extremely tight tolerances. A plurality of such cavities may be assembled into a resonant filter structure for a gas sensing device such as a spectrometer, or a mobile device such as a mobile phone handset. The high Q nature of the cavities has the effect of providing a very long absorption path length within the gas sample, while keeping the overall dimensions compact. For the mobile device application, the high Q of the cavity gives the resonant structure superior out-of-band rejection, and thus excellent signal-to-noise which may enable a reduction in power at both transmission and reception. This results in a cost-effective, robust and highly sensitive devices which can be deployed in challenging, hostile environments and in tight spaces.

For the gas sensing device described here, a solid state Gunn diode or an IMPATT diode may be used as mm wave source, which is coupled into a high-Q cavity resonant structure. These sources are precisely tunable, by varying the voltage applied to the diodes. The tunable range of the mm wave source may overlap an absorption feature of the gas sample, and the width of its emission spectrum may ideally be narrower thanks than the absorption feature.

For the mobile device application, the input signal may be an over-the-air mm wave RF signal, such as that radiated from an antenna, driven by a power amplifier. Both applications, the gas sensor and the mobile device, may used the high Q microwave cavity resonant structure described here.

A cavity resonant structure may function as a high-Q bandpass filter. When the cavity resonance matches the mm wave RF frequency, the cavity will pass the RF energy with low loss. When the cavity and radiation are mis-matched, the radiative energy will be blocked or attentuated. Designs often achieve 80 dB rejection. If the sample gas is admitted into this cavity, the Q and the rejection ratio will be degraded in proportion to the concentration and the intrinsic absorption strength of the sample gas.

In this disclosure a design and a method of manufacture of a cavity filter that is suitable for high volume and low cost manufacturing is described. The method using the cavity filter may receive the electromagnetic radiation directly, without conversion to the acoustic domain as in the SAW filters. Because the vacuum wavelength at the 28 GHz and 77 GHz bands is adequately short (1 cm and 0.4 cm, respectively), cavities of length on the order of 5 mm or less can be fabricated at low cost and in high volume using process tools of a previous generation.

Several fabrication methods are disclosed here. In one method, a plurality of Si wafers each with an identical through wafer, etched aperture may be stacked to form lithographically precise cavities. These cavities may be metalized with Au or another suitable metal of high conductivity, to complete the cavity. A plurality of cavities may be arranged in series to create resonances that are very slightly offset from one another to (1) improve the out of band attenuation, (2) broaden the passband, and (3) sharpen the roll-off between the passband and the rejection band. The cavities in such a series can be connected with small ports (apertures) that do not degrade the Q of each cavity, yet allow the radiation to be passed through the entire series.

Cavities can be created in a manner that they all lie in the same plane. Alternatively, the cavities can be formed on both sides of a starting substrate and connected by a port.

Cavities should preferably have a long aspect ratio so that a mode that is set up in the transverse direction will be at a much higher frequency and thus not interfere with the desired signal band. Alternatively, the transverse sidewalls can be formed so that they are not parallel. This will inhibit a resonance along the transverse axis.

Manufacturing tolerances can be estimated as follows. Considering a communication band centered at 28 GHz, a cavity 0.5358 cm in length is needed to fulfill the $l_{vac}/2$ criterion. If a conservative lithographic tolerance of +/−1 um is imposed on the cavity length, a resulting passband shift of only +/−10 MHz results. For 4 GHz pass band centered about 28 GHz, the 5 MHz error is 2.5 part per thousand (ppt). For comparison current SAW technology provides ~1 MHz tolerance in 60 MHz pass band, or roughly 16 ppt.

Accordingly, described here is a mm wave passband filter for a mobile device. The passband filter may include at least one lithographically fabricated high-Q resonant structure, wherein the resonant structure has at least one cavity formed in a semiconductor substrate, wherein the at least one cavity has a characteristic dimension of about one half of a wavelength in the frequency spectrum of the mm-wave signal, wherein the at least one cavity is dimensioned to define a resonant structure for at least some frequencies in the frequency spectrum of the mm wave source, and the characteristic dimension is between about 0.1 mm and 7 mm.

A method for manufacturing a mm wave passband filter on a substrate is also described. The method may include forming a through substrate feature on at least one substrate using photolithographic methods, wherein the feature has a characteristic dimension, aligning the substrates such that the through substrate feature is registered with the through substrate feature in the adjacent substrates, and bonding the plurality of substrates together form at least one cavity in a substrate stack.

These and other features and advantages are described in, or are apparent from, the following detailed description.

BRIEF DESCRIPTION OF THE DRAWINGS

Various exemplary details are described with reference to the accompanying drawings, which however, should not be taken to limit the invention to the specific embodiments shown but are for explanation and understanding only.

FIG. 7A-7F show a process for making the resonant filter using aluminum as the bulk material;

FIG. 8A-8G show a process for making the resonant filter using a silicon multi-wafer stack as the material; and FIG. 9A-9I show steps in another a process for making the gas sensor or a mobile device using a metallized silicon wafer as the substrate material.

It should be understood that the drawings are not necessarily to scale, and that like numbers maybe may refer to like features.

DETAILED DESCRIPTION

Figure 1:
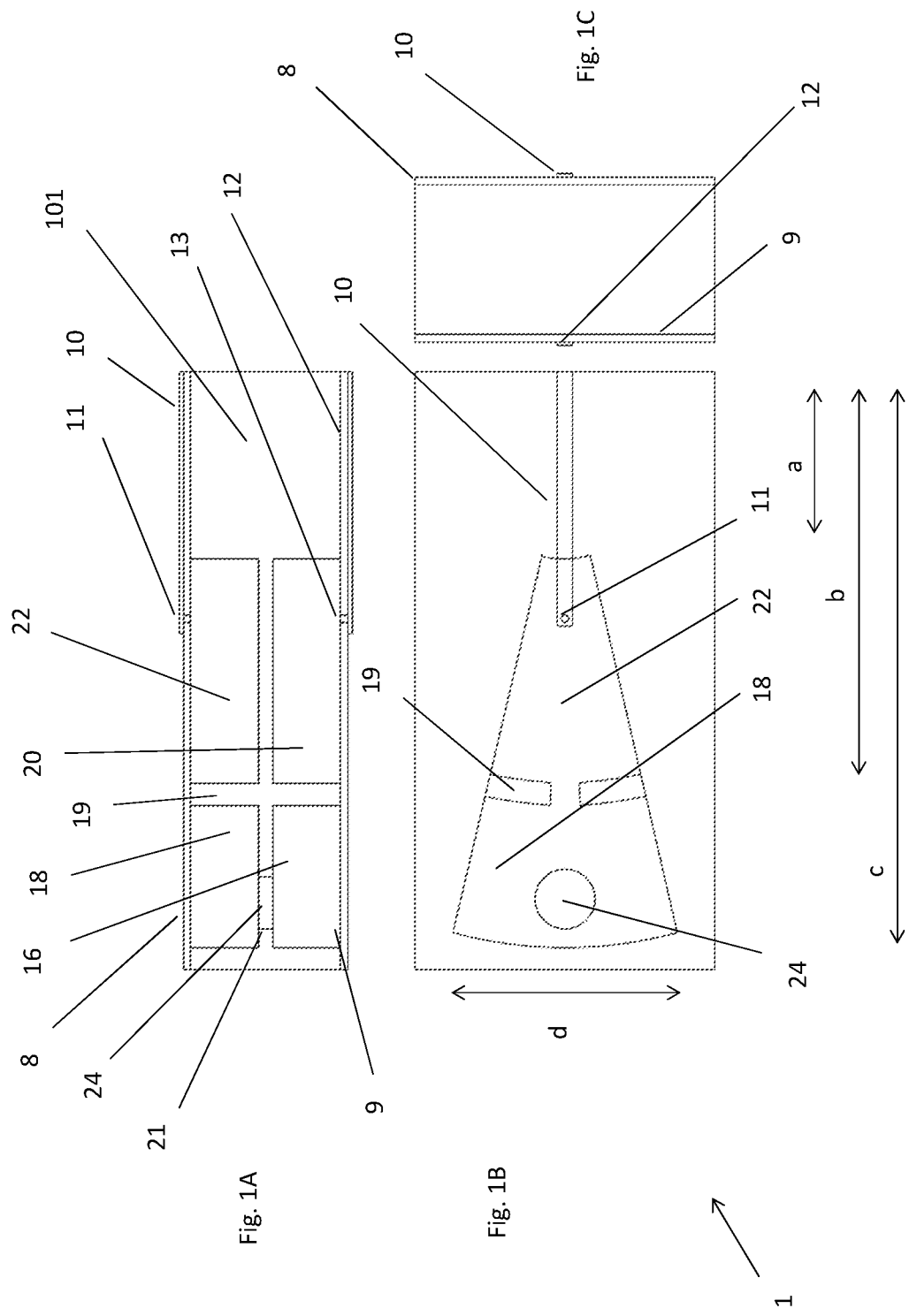
FIG. 1A is an illustrative exemplary cross sectional view of a first embodiment of a mm wave resonant structure.
FIG. 1B is an illustrative exemplary plan view of a first embodiment of a mm wave resonant structure.
FIG. 1C is an illustrative exemplary cross sectional end view of a first embodiment of a mm wave resonant structure.

Gases are composed of low molecular weight molecules, since only small molecules are gaseous at ambient temperatures. In the gas phase, these small molecules are constantly moving in highly precise quantum rotational states. The energy levels of these quantum states are extensively cataloged and the transition energies between states are known to a very high precision, nine significant figures (one part per billion or ppb). By detecting the microwave or mm wave emission from interstellar dust clouds, radio astronomers can unambiguously identify the molecular species in the dust clouds, even though the clouds are 10's-100's of light years distant. This emission occurs from the molecule when it relaxes from one rotational quantum state to a lower rotational quantum state. The identification is possible because the emission frequency is precisely known to 1 ppb and thus provides a fingerprint for the molecule. These emission frequencies are generally in the microwave or mm wave part of the electromagnetic spectrum, or roughly 10-500 GHz.

Mobile devices may communicate wirelessly, using mm waves for transmission and reception. The resonant structure described here may be tuned to pass a predefined frequency and reject others with an impressive signal-to-noise ratio (SNR).

The term "mm wave", used throughout this document, should be understood to refer to radiation in this frequency range, which corresponds to free space wavelengths of on the order 0.5 to 30 mm. Such radiation will simply be referred to as mm wave for the remainder of this disclosure.

Cavity filters are a class of filter that employs a cavity in which a standing wave is established at the desired passband frequency. This standing wave, or resonance, occurs when the cavity length is one half the wavelength of the electromagnetic radiation in vacuum or air ($l_{vac}/2$). This type of filter can have very good transmission characteristics at the resonance frequency, and also very good rejection (attenuation) of spurious signals and noise outside of the desired band of frequencies.

A "high-Q cavity" should be understood to mean a cavity in which a photon or wave may be reflected from the walls of the cavity at least about 10 times, or in alternative language, that the width of the passband is about 0.05 wavenumbers at about 15 GHz. Furthermore, orientational references such as "up", "down", "top", "bottom" may be interchangeable, as the device may be operated or fabricated in any orientation. The term "characteristic dimension" should be understood in the context of a resonant frequency, wherein the characteristic dimension is about ½ of the wavelength of the corresponding frequency of interest. For example, if the frequency is about 14.8 GHz, the corresponding wavelength is about 20 mm, and so the characteristic dimension is about 10 mm. This dimension should be along a major axis of the device. A "pole" is a natural frequency of vibration that occurs at infinite (finite if loss is present) attenuation.

The terms "wafer" and "substrate" are used interchangeably herein, to denote a flat, generally circular material upon which structures can be fabricated lithographically. The term "mobile device" should be understand to mean a computing or communication device, such as a tablet, laptop or smart phone, which may be battery powered and carried by the user. The term "resonator", "high-Q resonator" and "resonant structure" are used synonymously and interchangeably to refer to a structure with a passband in the mm wave spectral range, wherein the passband determined by its geometry.

As mentioned above, these precise transition frequencies can be used terrestrially to sense and identify gases for applications such as air pollution monitoring, automotive engine performance optimization, industrial chemical synthesis control, automotive passenger compartment $CO_2$ sensing, home carbon monoxide sensing, fermentation process control, and indoor agriculture. Alternatively, for the mobile devices, one may use a frequency band which is modulated to encode information for transmission wirelessly to/from the mobile device.

The following discussion presents a plurality of exemplary embodiments of the novel photolithographically fabricated mm wave resonant cavity. The following reference numbers are used in the accompanying figures to refer to the following:

1, 2, 3, 4 resonant cavities
 8, 9 top, bottom insulating layers
 10, 12 input, output conductor
 11, 13 input, output aperture
 19, 21 vertical, horizontal dividing walls
 22 First cavity
 18 Second cavity
 16 Third cavity
 20 Fourth cavity
 24, 24' Cavity aperture
 30 PZT
 34 detector
 36 source
 101 First substrate material
 150 Malleable starting material
 160 Semiconductor substrate
 165 Semiconductor substrate stack
 200 Stamp/mandrel FIG. 1 shows a first representative mm wave resonant structure 1, consisting of four cavities or "poles." As is well known from filter theory, the dimensions of each of these poles can be shifted slightly to optimize the width of the passband, and the sharpness of the cut off frequencies, that is, the cut off characteristics of the band rejection. It should be understood that this embodiment, as those following, is exemplary only, and that the mm filter structure may use any number of resonant cavities, including just a single resonant cavity. Each resonant filter may include at least one such resonant structure 1.

FIG. 1A is a cross-sectional diagram of the mm wave resonant structure 1 formed on a substrate, with the cross section taken along the longitudinal axis. In FIG. 1A, reference number 10 refers to an input conductor, and reference number 12 refers to an output conductor. The input conductor 10 may deliver a mm wave signal from a mm wave source, which is not shown in FIG. 1, but could be an IMPATT diode or a Gunn diode, for example, as will be discussed further below. For the mobile device application, the input signal may be a mm wave RF signal transmitted over-the-air from an mm wave RF antenna, for example, driven by a power amplifier.

As shown in FIG. 1A, the resonant cavity 1 may include a mm wave resonant structure formed with four cavities 16, 18, 20, and 22. The first cavity, 22 may receive the signal from the source or antenna through an input aperture 11 from the input conductor 10. The signal is then transmitted from the first cavity 22 to the second cavity 18 through a hole in a vertical wall 19, which may be seen more clearly in the plan view of FIG. 1B. From the second cavity 18, the signal may be transmitted through another aperture 24 though the horizontal wall 21, into the third cavity 16. The signal is then transmitted from the third cavity 16 to the fourth cavity 20 through an similar aperture 19 in the vertical wall. The signal may finally be delivered from the fourth cavity 20 to an output aperture 13, and then to the output conductor 12.

These cavities may be separated by walls comprising the remaining material of the substrate 101. Thus the cavities 22 and 18 may be separated vertically by a silicon or metallized silicon wall or aperture 19, and horizontally by wall 21. Similarly, cavities 16 and 20 they may be separated vertically by wall or aperture 19, and horizontally by wall 21. These voids or cavities may include metallic side walls, or they may be coated with a metallic, reflective material. The sidewall coating may be, for example, gold. In other embodiments, the metallic sidewall coating may be nickel, copper, aluminum or silver, for example.

The cavities 16, 18, 20, and 22 maybe dimensioned so as to support resonant excitation by the input signal. Accordingly, some frequencies in the input signal may be well supported by the cavity structure, where as other frequencies will not. Therefore, the structure may act as a band pass filter, passing some frequencies with low loss, while attenuating other frequencies.

FIG. 1B is the plan view of the mm wave resonant structure that was shown in cross section in FIG. 1A. In the plan view of FIG. 1B, only the upper surface is visible. Accordingly, of the four cavities 16, 18, 20, and 22, only two, 18 and 22, are shown in FIG. 1B. Similarly, of the conductors 10 and 12, only 10 is shown in FIG. 1B.

FIG. 1B shows more clearly the placement of the through hole 24 and the through hole 11. As shown in FIG. 1B, the input signal may travel along input line 10 through hole 11, and into the first cavity 22. The signal may resonate in cavity 22, if the cavity has been designed to support the mode. Cavity 22 is then coupled into the second cavity 18 through the aperture in wall 19. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13.

From second cavity 18, the signal is coupled into the lower cavity 16, by through hole 24 as shown in the plan view of FIG. 1B. From the lower cavity 16, the excitation is coupled into the fourth and final cavity 20, and then through the lower hole 13, and to the output conductor 12.

FIG. 1C shows the end on cross sectional view of the mm wave resonant structure. In this view, only the input conductor 10 and the output conductor 12 are shown. The other layered features 8 and 9 may be an insulating layer that isolates the input and output conductors from the rest of the metallic or semiconductor substrate.

What follows are some exemplary dimensions for some important features in the structure 1. It should be understood that these dimensions are exemplary only, and that other dimensions can be used, depending on the application. Referring to FIG. 1B, dimension "a" may be about 10 mm, dimension "b" may be about 25 mm, dimension "c" may be about 28 mm, and dimension "d" may be about 4 mm. The aperture 24 diameter may be about 2.5 mm and the input and output apertures 11, 13 may be less than about 1000 microns (1 mm). The width of walls 19 and 21 may be about 1 mm. The width of input 10 and output 12 conductors may be about 50-100 microns. The angle subtended by the resonant structure may be about 10 degrees to about 30 degrees, although as discussed below the cavities may also be rectangular.

Figure 2:
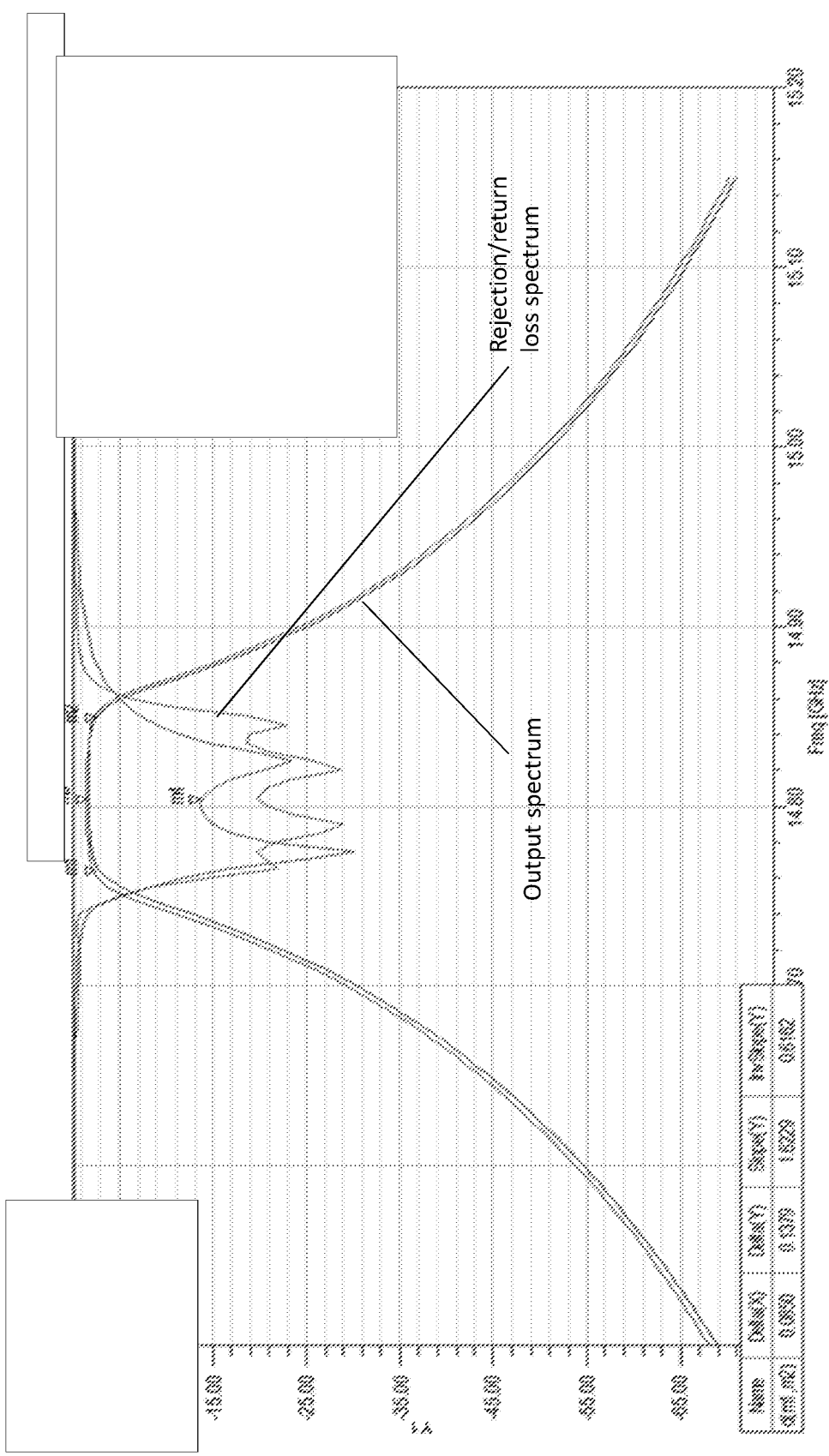
FIG. 2 is a graph showing a typical passband characteristics of a cavity filter or mm wave resonant structure.

FIG. 2 is a chart showing the spectral response of the component of the resonant structure shown in FIGS. 1A, 1B and 1C. FIG. 2 shows the frequency response to an input signal having components primarily between 14 and 15 GHz. As seen in FIG. 2, the transmitted signal (output spectrum) is relatively flat over the passband of this resonant cavity. In contrast, the returned signal has considerable amplitude variation in its spectral content. That is, the reflected signal has a rather complex frequency dependence. The notches at around 14.76 and 14.82 GHz result from the response of the cavities with respect to the frequency components of the signal. The passband of the resonant filter is about 0.3 GHz (300 MHz) at about 14.5 GHz, or about 0.166 wavenumbers. As can be seen in FIG. 2, the structure shown in FIGS. 1A, 1B and 1C does indeed act like a bandpass filter with respect to the frequency content of this input signal.

Similar structures can be made with fewer or more poles or cavities. However, a typical passband characteristic for the four-cavity resonant structure 1 may be as shown in FIG. 2.

Figure 3:
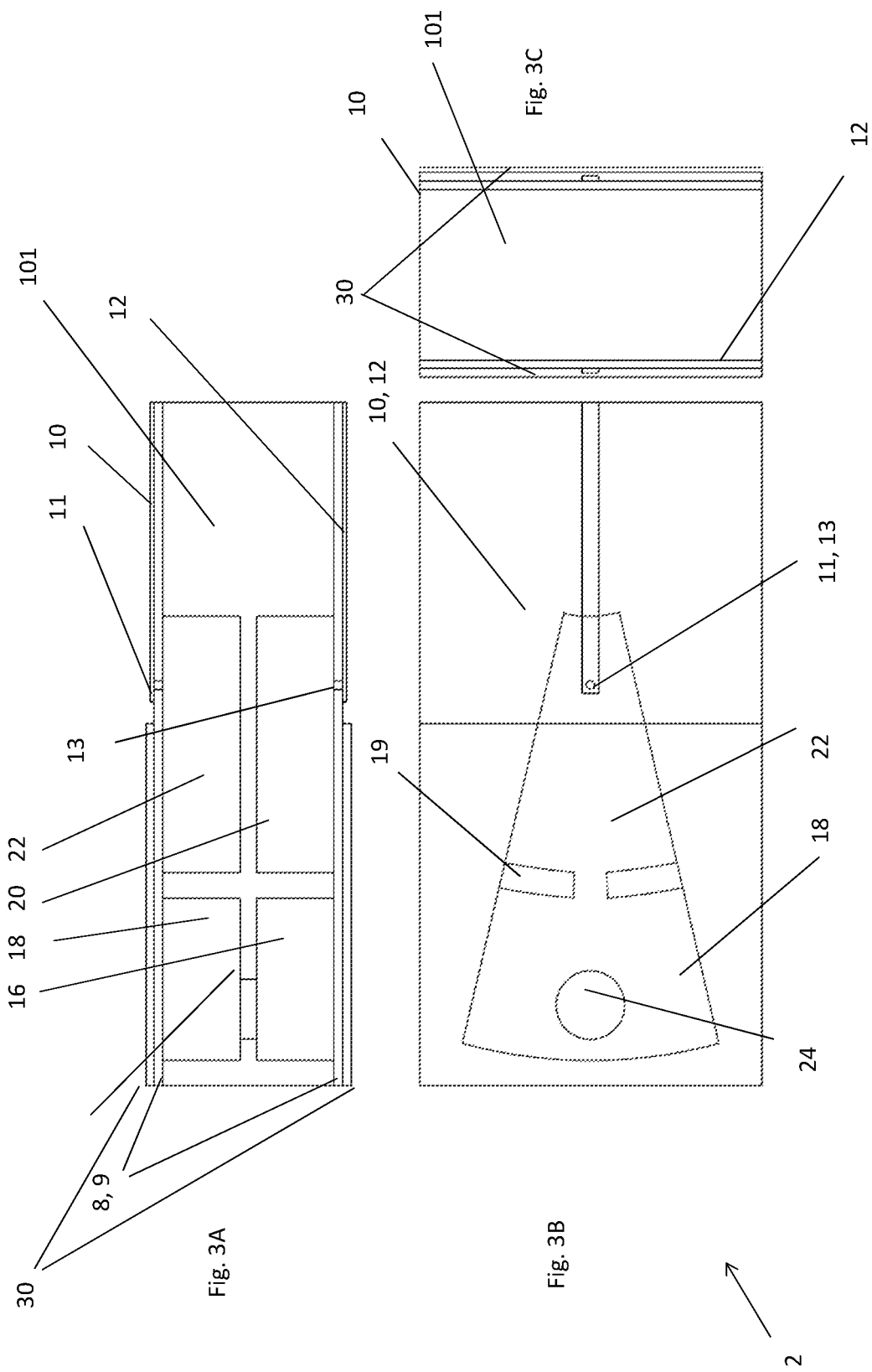
FIG. 3A is an illustrative exemplary cross sectional view of a second embodiment of a mm wave resonant structure.
FIG. 3B is an illustrative exemplary plan view of a second embodiment of a mm wave resonant structure.
FIG. 3C is an illustrative exemplary cross sectional end view of a second embodiment of a mm wave resonant structure.

If the top and bottom plates are made to be deformable, the cavity resonance frequency may be tuned. Deformability of these top and bottom plates can be achieved by forming a bi-morph of Si and lead zirconate titanate (PZT), for instance, as shown in FIG. 3. PZT is an inorganic compound with the chemical formula $Pb[Zr_xTi_{1-x}]O_3$ ($0 \leq x \leq 1$). PZT is a ceramic perovskite material that shows a marked piezoelectric effect, meaning that the compound changes shape when an electric field is applied. It is used in a number of practical applications such as ultrasonic transducers and piezo-electric resonators. This bi-morph could also be fabricated from Si and AlN, and other materials as well, to form a layered structure. The bi-morph may be used to alter the effective dimension of the cavity, and thus may de-tune, broaden or shift the passband of the cavity with respect to the radiation.

FIG. 3 is a diagram of this embodiment of the mm wave resonant structure 2. The mm wave resonant structure may have a top and bottom plate covering the at least one cavity, wherein at least one of the top and bottom plates are deformable, such that the resonant characteristics of the at least one cavity can be tuned. FIG. 3A shows the mm wave resonant structure in longitudinal, cross sectional view. FIG. 3B shows the structure in plan view, and FIG. 3C shows the structure in end-on cross section.

FIGS. 3A, 3B and 3C show this representative embodiment of the mm wave resonant cavity structure consisting of four cavities or "poles." As with the previous embodiment, the dimensions of each of these poles can be shifted slightly to optimize the width of the passband, and/or the sharpness of the cut off frequencies, that is, the cut off characteristics of the band rejection. This shift may be accomplished with the deformable PZT layers 30.

As described above with respect to FIG. 1, FIG. 3A is a cross-sectional diagram of the mm wave resonant structure 2. In FIG. 3A, reference number 10 refers to an input conductor, and reference number 12 refers to an output conductor. As shown in FIG. 3A, a substrate 101 may be formed with four cavities 16, 18, 20, and 22.

These cavities may be separated by remaining material of the substrate 101. They may be separated vertically by wall with aperture 19, and they may be separated horizontally by wall with aperture 21 A hole 11 formed in the input conductor 10, can inject the signal carried on conductor 10 or received over-the-air into the first void, or cavity, 22. The structure shown in FIG. 3A includes four voids, or cavities. These voids or cavities may include metallic side walls, or they may be coated with a metallic, reflective material. The sidewall coating may be, for example, gold. In other embodiments, the metallic sidewall coating may be nickel, copper, aluminum or silver, for example.

As before, the cavities 16, 18, 20, and 22 maybe dimensioned so as to support resonant excitation by the input signal. Accordingly, some frequencies in the input signal may be well supported by the cavity structure, whereas other frequencies will not. Therefore, the structure may act as a band pass filter, passing some frequencies with low loss, while attenuating other frequencies.

The addition of PZT layers 30 in FIG. 3A, allows the dimensions of the cavities or voids 16, 18, 20 and 22 to be varied slightly but significantly. As described above, the variation of the exact dimensions of the cavities will alter the passband performance of the structure. These variations may be used to correct manufacturing deviations or errors. Alternatively, the deviation, if sufficient, may be used to tune the structure to an absorption feature of another component of the gas sample. It may also be possible to detune each cavity or void 16, 18, 20 and 22 to a different dimension, to alter, for example to widen or blur, the passband features of the structure. The PZT layers 30 may be disposed over all, or over a portion of the cavities 16, 18, 20 and 22, as shown.

FIG. 3B is the plan view of the component of the mm wave resonant structure 2 that was shown in cross section in FIG. 3A. In the plan view only the upper surface is visible. Accordingly, of the four cavities 16, 18, 20, and 22, only two, 18 and 22, are shown in FIG. 3B. Similarly, of the conductors 10 and 12, only 10 is shown in FIG. 3B.

FIG. 3B shows more clearly the placement of the through hole 24 and the through hole 11. As shown in the previous embodiment, the input signal travels along input line 10 through hole 11, and into the first cavity 22. The signal begins resonant excitation of cavity 22 which is then coupled into the second cavity 18. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13.

From second cavity 18, the signal is coupled into the lower cavity 16, by through hole 24 as shown in the plan view of FIG. 3B. From the lower cavity 16, the excitation is coupled into the fourth and final cavity 20, through the lower whole hole 13, and onto the output conductor 12.

Because of the plan view of FIG. 3B, the PZT structure cannot be seen in FIG. 3B, however, its placement is shown in FIG. 3C. FIG. 3C shows the end on view of the mm wave resonant structure 2. In this view, only the input conductor 10 and the output conductor 12 are shown. The other layered features 8 and 9 may be an insulating layer that insulates the input and output conductors from the rest of the metallic or semiconductor substrate. The PZT layers 30 are shown on the top and the bottom of resonant structure 2.

A Gunn diode, also known as a transferred electron device (TED), is a form of diode, a two-terminal passive semiconductor electronic component, with negative resistance, used in high-frequency electronics. It is based on the "Gunn effect" discovered in 1962 by physicist J. B. Gunn. Its largest use is in electronic oscillators to generate microwaves, in applications such as radar speed guns, microwave relay data link transmitters, and automatic door openers. For the mobile device application, the input signal may be a mm wave signal transmitted over-the-air from an mm wave RF antenna, for example, driven by a power amplifier.

The Gunn diode has an internal construction is unlike other diodes in that it consists only of N-doped semiconductor material, whereas most diodes consist of both P and N-doped regions. It therefore does not conduct in only one direction and cannot rectify alternating current like other diodes. In the Gunn diode, three regions exist: two of those are heavily N-doped on each terminal, with a thin layer of lightly n-doped material between. When a voltage is applied to the device, the electrical gradient will be largest across the thin middle layer. If the voltage is increased, the current through the layer will first increase, but eventually, at higher field values, the conductive properties of the middle layer are altered, increasing its resistivity, and causing the current to fall. This means a Gunn diode has a region of negative differential resistance in its current-voltage characteristic curve, in which an increase of applied voltage, causes a decrease in current. This property allows it to amplify, functioning as a radio frequency amplifier, or to become unstable and oscillate when it is biased with a DC voltage.

An IMPATT diode (IMPact ionization Avalanche Transit-Time diode) is a form of high-power semiconductor diode used in high-frequency microwave electronics devices. They have negative resistance and are used as oscillators to generate microwaves as well as amplifiers. They operate at frequencies between about 3 and 100 GHz or more. A main advantage is their high-power capability. These diodes are used in a variety of applications from low-power radar systems to proximity alarms. A major drawback of using IMPATT diodes is the high level of phase noise they generate. This results from the statistical nature of the avalanche process.

Figure 4:
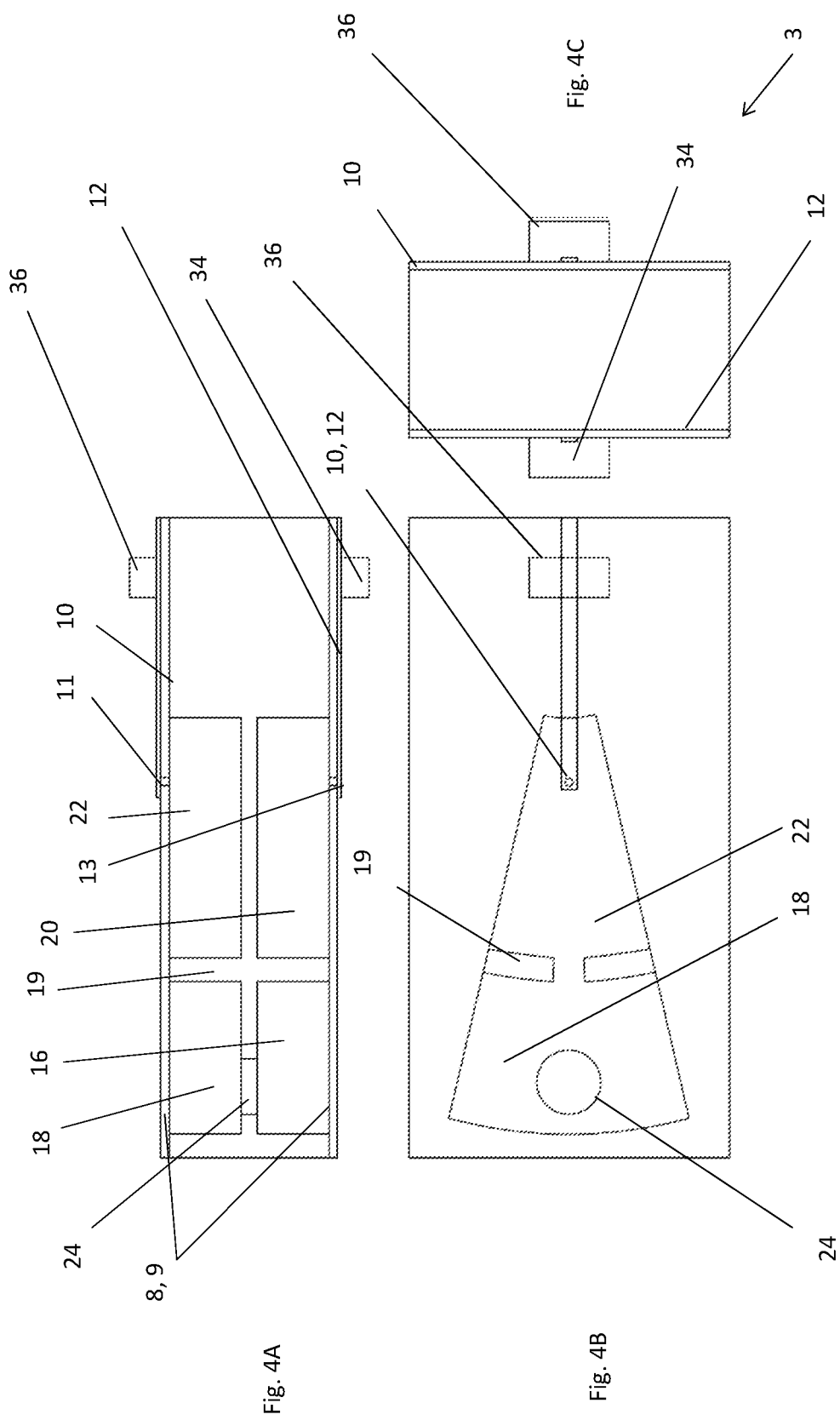
FIG. 4A is an illustrative exemplary cross sectional view of a third embodiment of a mm wave resonant structure.
FIG. 4B is an illustrative exemplary plan view of a third embodiment of a mm wave resonant structure.
FIG. 4C is an illustrative exemplary cross sectional end view of a third embodiment of a mm wave resonant structure.

FIG. 4 is another embodiment of a mm wave resonant structure 3, which is configured as a mm wave spectrometer. A tunable source 36, for example an IMPATT or Gunn diode, is mounted on the top input conductor 10 of the structure. As a detector 34, a zero bias Schottky diode or an avalanche detector, for example, is mounted on the bottom conductor 12.

FIG. 4A shows a cross sectional view of this embodiment of mm wave resonant structure 3; FIG. 4B is an illustrative exemplary plan view of this embodiment of mm wave resonant structure 3; FIG. 4C is an illustrative exemplary cross sectional end view of this mm wave resonant structure 3.

As described above with respect to FIG. 1, in FIG. 4A, reference number 10 refers to an input conductor, and reference number 12 refers to an output conductor. As shown in FIG. 4A, a substrate one may be formed with four cavities 16, 18, 20, and 22.

As before, these cavities may be separated by remaining material of the substrate 101. They may be separated vertically by 19, and they may be separate horizontally by 21. A hole 11 formed in the input conductor 10, can inject the signal carried on conductor 10 into the first void, or cavity, 22. The structure shown in FIG. 4A includes four voids, or cavities, 16, 18, 20 and 22. These voids or cavities 16, 18, 20 and 22 may include metallic side walls, or they may be coated with a metallic, reflective material.

The cavities 16, 18, 20, and 22 maybe dimensioned so as to support resonant excitation by the input signal. Accordingly, some frequencies in the input signal may be well supported by the cavity structure, where as other frequencies will not. Therefore, the structure may act as a band pass filter, passing some frequencies with low loss, while attenuating other frequencies.

As shown in FIG. 4A, the source 36 may be disposed on top of the input conductor 10 and in electrical communication with input conductor 10. Radiation from source 36 may travel down conductor 10 and into the first cavity through aperture 11. Alternatively, source 36 may be disposed directly over the aperture 11 to transmit signal directly into first cavity 22. In any case, the signal from source 36 may be filtered by resonant structure 3.

FIG. 4B is the plan view of the component of the resonant structure that was shown in cross section in FIG. 4A. In the plan view only the upper surface is visible. Accordingly, of the four cavities 16, 18, 20, and 22, only two, 18 and 22, are shown in FIG. 3B. Similarly, of the conductors 10 and 12, only 10 is shown in FIG. 4B.

FIG. 4B shows more clearly the placement of the through hole 24 and the through hole 11 the placement of source 36 and detector 34. As shown in FIG. 4B, the input signal travels along input line 10 through hole 11, and into the first cavity 22. The signal begins resonant excitation of cavity 22 which is then coupled into the second cavity 18. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13.

From second cavity 18, the signal is coupled into the lower cavity 16, by through hole 24 as shown in the plan view of FIG. 1B. From the lower cavity 16, the excitation is coupled into the fourth and final chamber 20, through the lower whole hole 13, and onto the output conductor 12 and onto detector 34.

FIG. 4C so shows the end on view of the component of the resonant structure. In this view, only the input conductor 10 and the output conductor 12 are shown. The other layered features 8 and 9 may be an insulating layer that insulates the input and output conductors from the rest of the metallic substrate.

FIG. 4C shows a suggested placement of source 36 and detector 34. The IMPATT diode 36 is shown mounted atop the conductive layer 10. This source 36 may be swept or tuned through a range of frequencies by sweeping the voltage delivered to the diode through a range of voltages. The sweep may be repeated many times, by varying the voltage sinusoidally, or as a ramp function, for example. The detector Shottky diode 34 may be coupled to a lock in amplifier to detect the signal as a function of the swept input voltage/frequency. When the output frequency of the source 36 is tuned to an absorption band of the gas species, the radiation is absorbed by the gas along the entire path length of the radiation through the resonant cavities. Because of the high-Q nature of the cavities, the effective path length may be quite long, resulting in good signal-to-noise measurement.

Using this swept frequency approach, the device 3 may function as a spectrometer, such that the absorption spectrum of the GAS disposed with the resonant cavities 18, 20, 16 and 22 measured, and thus the gaseous components are identified.

Figure 5:
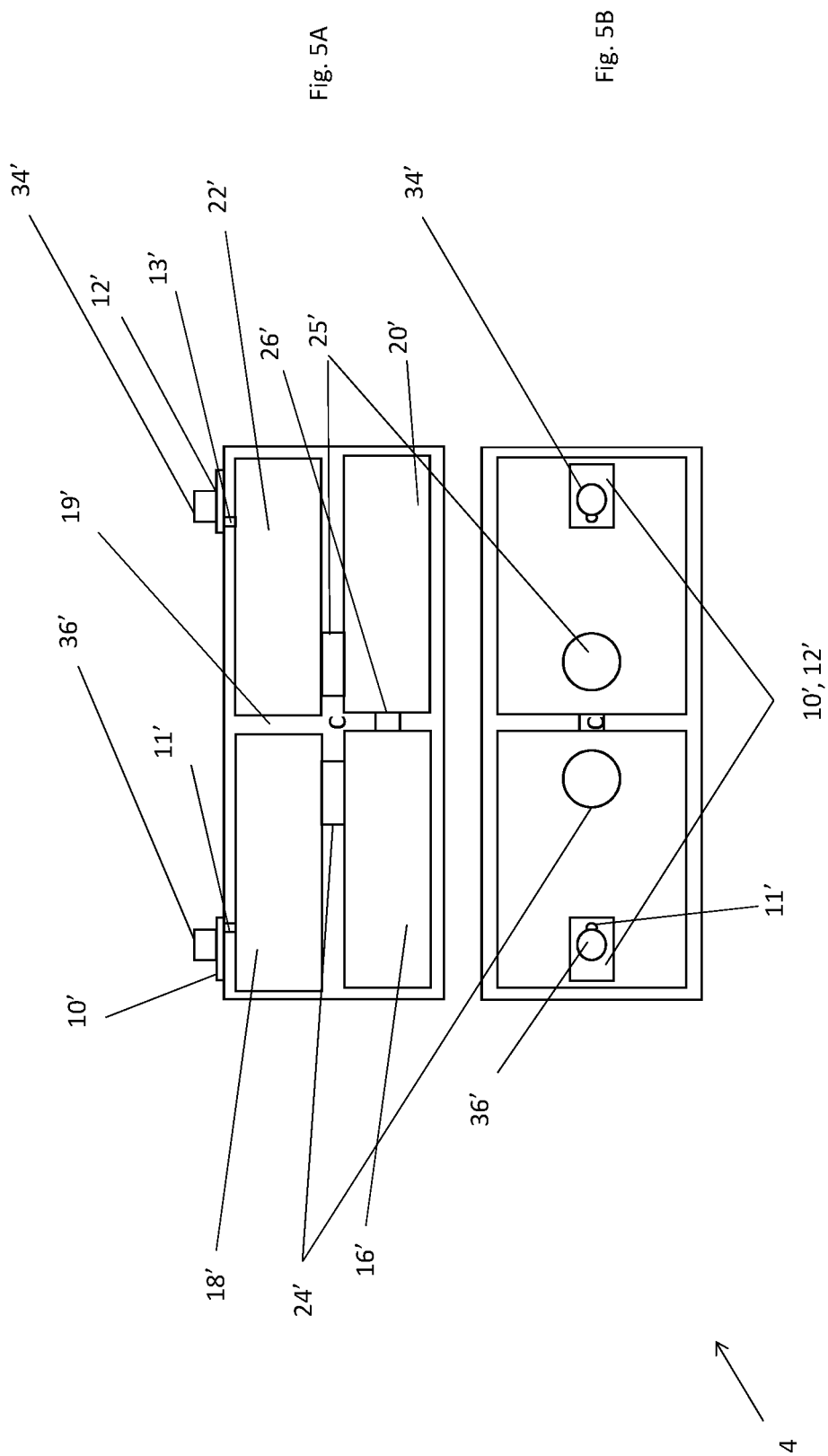
FIG. 5A is an illustrative exemplary cross sectional view of a fourth embodiment of a mm wave resonant structure.
FIG. 5B is an illustrative exemplary plan view of a fourth embodiment of a mm wave resonant structure.

FIG. 5 is another embodiment of a mm wave resonant structure 4. The structure 4 shown in FIG. 5 may have the source 36 and the detector 38 on the same side of the structure. This embodiment may offer manufacturing or implementation advantages, as only one surface may need to be accessed. FIG. 5A shows a cross sectional view of this embodiment of mm wave resonant structure 4; FIG. 5B is an illustrative exemplary plan view of this embodiment of mm wave resonant structure 4, showing placement of the source and detector. Otherwise, the structure is similar to that shown in FIG. 1.

In FIG. 5, reference numbers with a single quote (') may refer to analogous features of the previous embodiments, though possibly adjusted for implementation in the same-side device shown in FIG. 5. Accordingly, reference number 10' may refer to an input conductor, and reference number 12' may refer to an output conductor. The input conductor 10' may deliver a mm wave signal from a mm wave source, which is not shown in FIG. 5, but could be an IMPATT diode or a Gunn diode, for example, as was discussed above.

In FIG. 5, the resonant structure may include four cavities, wherein all the cavities lie in substantially the same plane. The four cavities may be configured to have a passband with a width of about 4 GHz and centered at about 28 GHz. At least one cavity may have an aspect ratio (length:width) of at least about 5:1.

As shown in FIG. 5A, a mm wave resonant structure 4 may be formed with four cavities 16', 18', 20', and 22'. It should be noted that although the reference numbers used for the cavities 16', 18' 20' and 22' have not changed with respect to which cavity within the structure they refer, the route of the radiation through the resonant structure 4 has changed, because of the movement of the detector 34' to the top side of the device. Accordingly, the new path may be as follows.

In this architecture, the first cavity, 18' may receive the signal from the source through an input aperture 11'. The signal is then transmitted from the first cavity 18' to the second cavity 16' through a hole 24' in a vertical wall, which may be seen more clearly in the plan view of FIG. 5B. From the second cavity 16', the signal may be transmitted through another aperture 26' though the wall, into the third cavity 20'. The signal is then transmitted from the third cavity 20' to the fourth cavity 22' through an similar aperture 25' in the wall. The signal may finally be delivered from the fourth cavity 22' to an output aperture 13', and then to the output conductor 12'.

As shown in FIG. 5B, both the source 36' and the detector 34' may be disposed on the same surface of the resonant structure 4. This may require changes to the placement of apertures 24' and 25', such that aperture 24' transmits signal from first cavity 18' to second cavity 16'. Aperture 25' may transmit the signal from cavity 20' to cavity 22'. From cavity 22' the signal is directed to the detector 34'.

As before, the cavities 16', 18', 20', and 22' maybe dimensioned so as to support resonant excitation by the input signal. Accordingly, some frequencies in the input signal maybe well supported by the cavity structure, whereas other frequencies will not. Therefore, the structure may act as a band pass filter, passing some frequencies with low loss, while attenuating other frequencies.

FIG. 5B is the plan view of the component of the mm wave resonant structure that was shown in cross section in FIG. 5A. In the plan view only the upper surface is visible. Accordingly, of the four chambers 16', 18', 20', and 22', only two, 18' and 22', are shown in FIG. 5B. Both conductors 10' and 12' are shown in FIG. 5B.

FIG. 5B shows more clearly the placement of the through hole 24' and the through hole 11'. As shown in FIG. 5B, the input signal travels along input line 10' through hole 11', and into the first chamber 18'. The signal is reflected back and forth between the wall of cavity 18', and is then coupled into the second chamber 16'. Because of the resonant behavior of the structure with respect to an excitation signal, the signal may be reflected back and forth between the sidewalls of each cavity many times. Accordingly, the signal may traverse the dimension of the cavity many times, before finally exiting at the exit port 13'. From the exit port 13' in the last chamber 22', the excitation directed onto the detector 34', disposed on the same side as the source 36'.

Figure 6:
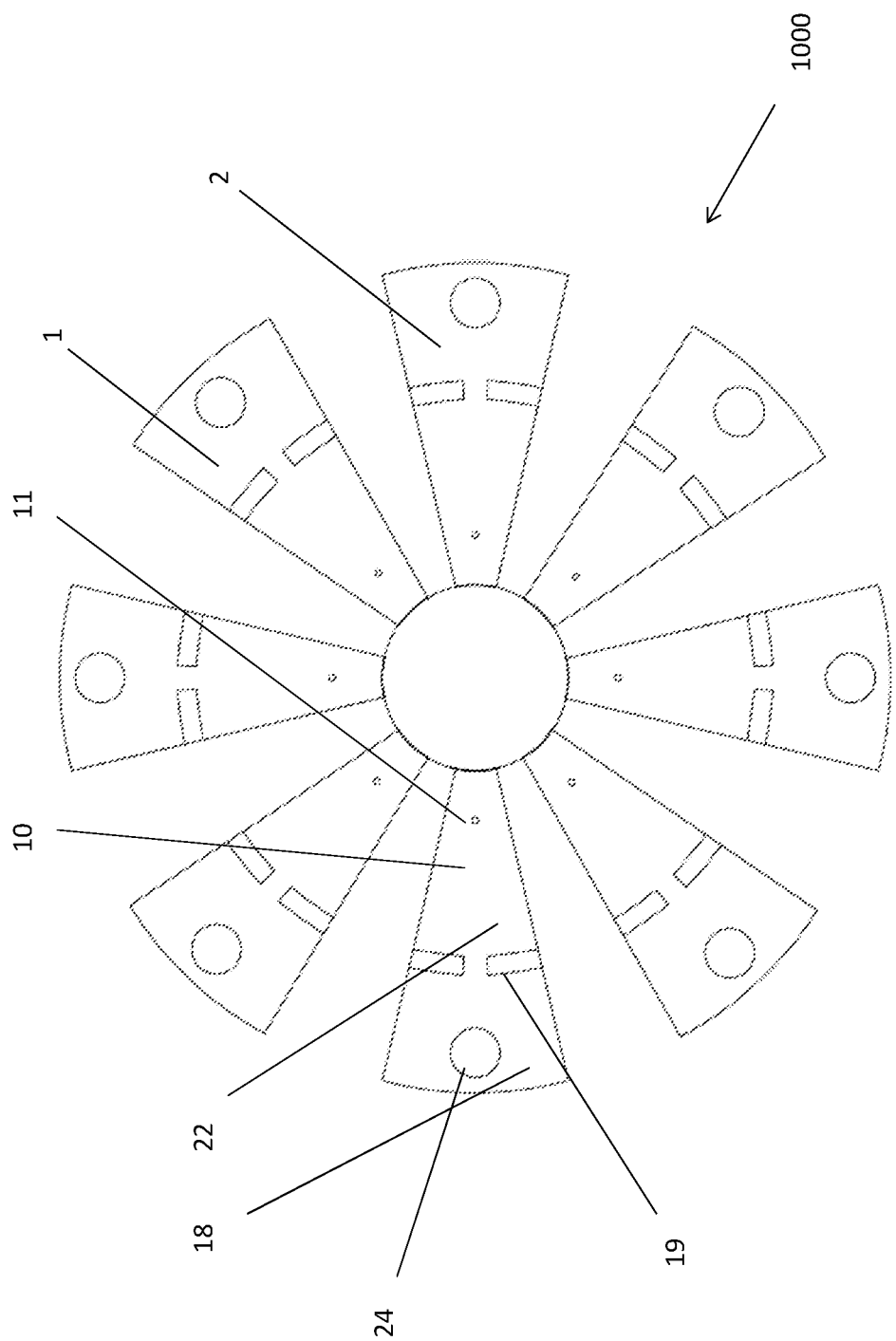
FIG. 6 is a composite 8-component, symmetrical resonant filter using the mm wave resonant structures illustrated previously.

FIG. 6 shows a fully configured eight-component resonant filter 1000. This embodiment maybe circular, and symmetric, and include eight of the components previously illustrated in FIG. 1, 3, 4 or 5. The structure shown in FIG. 6 is exemplary only, and other embodiments having other numbers of resonant cavities, laid out either recti-linearly or circularly, or in any other orientation with respect to one another, are also envisioned. The resonant filter 1000 is shown with 8 resonant structures, of which only two are numbered 1, 2. It should be understood that the remaining unnumbered structures may be identical, or different to structures 1, 2. It should be understood, that especially for the mobile device filter 1000, the resonant cavities 1, 2 may be identical, i.e. they may use all the same structure, or they may be different, using for example resonant structure 1 (shown in FIG. 1) or resonant structure 2 (shown in FIG. 3). Any of the structures described above, for example resonant structure 1, 2, 3 or 4 may be used, for example, in the resonant filter device 1000 illustrated in FIG. 6.

As with the structure 3 illustrated in FIG. 4, the resonant filter 1000 may use an IMPATT diode or Gunn diode as a source. Although not shown in FIG. 6, the IMPATT diode 36 may be mounted atop the conductive layer 10. This source 36 may be swept or tuned through a range of frequencies by sweeping the voltage delivered to the diode through a range of voltages. The sweep may be repeated many times, by varying the voltage sinusoidally, or as a ramp function, for example. The detector Shottky diode 34 may be coupled to a lock in amplifier to detect the signal as a function of the swept input voltage/frequency.

When the output frequency of the source 36 is tuned to an absorption band of the gas species, the radiation is absorbed by the gas along the entire path length of the radiation through the resonant cavities. Because of the high-Q nature of the cavities, the effective path length may be quite long, resulting in good signal-to-noise measurement.

Using this swept frequency approach, the device 1000 may function as a spectrometer, such that the absorption spectrum of the gas disposed within the resonant cavities 18, 20, 16 and 22 is measured, and thus the gaseous components are identified.

Alternatively, mobile devices may communicate wirelessly, using mm waves. The resonant structure described here may be tuned to pass a predefined frequency and reject other with an impressive signal-to-noise ratio (SNR).

It should be understood that if a plurality of structures is used in such a device, each cavity may have the same or different resonant properties. For example, one structure may be designed to resonate a 14.8 GHz signal, and another designed to resonate a 18 GHz signal, depending on the application and the target gas species. Each resonant structure may be designed, for example, with the goal of measuring signal at a different absorption features of the same target gas, thus enhancing confidence in the outcome of the measurement. Or each structure may be tuned to an absorption feature of one of a plurality of gaseous species expected to be present. For example, each component 1, 2 may be tuned to detect a different species of environmental gases, such as $NO_2$, $N_2O$, $CO$, $CO_2$, $NO$, and $O_2$, for example.

Once again, each structure 1, 2 may comprise an input conductor 10 along with a feed through or aperture 11, and four cavities or voids, 16, 18, 20, and 22. Because of the plan view, only cavities 18 and 22 are visible in this illustration. The signal may enter along input line 10, and may be coupled into cavity 20 through the via feed through 11. The signal then resonates because the frequency of the signal matches the resonant structure of the cavity, and the high-Q nature of the structure. This excitation is transmitted through barrier 19 into the second cavity 18. The signal may also resonate in the second cavity 18. This excitation is then coupled through hole 24 into the lower cavity 16 (not seen). The signal is then coupled into the final cavity 20, through the hole 19, and into the final cavity 20. A similar path may be used in each resonant component, of which two are labelled 1 and 2 in FIG. 6.

Each resonant component may have a signal of a different frequency coupled thereto. Accordingly, each resonant component 1, 2 may be optimized to detect a different frequency. In the structure shown in FIG. 6, 8 separate channels are illustrated, although it should be understood that there may be fewer than 8 or more than 8, depending on the implementation. Each resonant component may have its own signal line and source diode to bring the signal to and from the structure, or some resonant components may share the same signal line and source diode, thus using the same frequency. Alternatively, each filter 1000 may resonate at 8 different frequencies and thus define 8 different channels.

From this final cavity, feedthrough hole 13 delivers the filtered signal to the output line 12. Output line 12 and aperture 13 are not seen in this figure because it lies directly beneath the input line 10 and aperture 11.

As with the individual components shown in FIGS. 1, 3, 4, and 5, the transmission properties of the structure shown are frequency dependent, and depend critically on the dimensions of the individual cavities 16, 18, 20, and 22. Furthermore each of these cavities on the eight different arms of this device may have somewhat different dimensions. Accordingly the frequency response of the entire structure may depend on the details of each of its components.

Accordingly passband filters may be made with quite complicated frequency responses.

This structures shown in FIGS. 1, and 3-6 may be made using forming techniques on a malleable material, or photolithographically on a semiconductor substrate, for example. Four exemplary fabrication methods are illustrated in remaining FIGS. 7, 8 and 9, and are described below.

In this disclosure, a design, a method of use, and a method of manufacture of a cavity filter that is suitable for high volume and low cost manufacturing is described. The method of use may employ the electromagnetic radiation directly, without conversion to the acoustic domain. Because the vacuum wavelength at the 28 GHz and 77 GHz bands is adequately short (1 cm and 0.4 cm, respectively), cavities of length on the order of 5 mm or less can be fabricated at low cost and in high volume using process tools of a previous generation. The method of manufacture may be any or all of the following four exemplary embodiments descried below.

Method 1

A first method of manufacturing the cavities is shown in FIG. 7, that employs lithographic, etching, and deposition methods typical of semiconductor manufacturing facilities.

The process starts on a Si wafer (FIG. 7A) that has a through hole 24 providing communication from the top to bottom cavities.

A first silicon substrate 160 may be formed with a through hole 24 form therein. Subsequent silicon substrates 165 may be formed with through holes that will define cavities 18, and 22 on the topside, and 16 and 20 on the bottom side. The subsequent substrates 165 maybe coupled above and below the first silicon substrate 160 to form a multi layer stack 165 as shown in FIG. 7B. Then a plurality of Si wafers may all be etched with identical through holes to define the cavities (FIG. 7B).

These wafers may be stacked to form the desired cavity depth, which is in the range of 100-500 um (2 to 10 wafers per side). These etches can be carried out using DRIE etch methods, which are well known and are not described here. Anisotropic wet etching of Si using KOH on <110> Si is also a viable process and is also well known. The stacked wafers are bonded to one another and to the each side of the starting wafer (FIG. 7C). Any bonding technology may be used, including anodic bonding and thermocompression bonding, for example. A highly conductive metal is then deposited into the cavities. This metal must cover the bottom and the sidewalls of the cavities (FIG. 7D). Final wafers are then bonded to each side of the stack to enclose the cavities (FIG. 7E). In one embodiment, the multilayer stack may have another intact silicon substrate bonded over the top and bottom of the stack, thereby enclosing the cavities or voids 16, 18, 20 and 22. The input (11) and output (13) apertures may then be etched into these intact silicon substrates as shown in FIG. 7F. These apertures 11, 13 may allow the input signal to be coupled into the first cavity or void, and the output signal to be coupled out of the last cavity or void.

Although not shown in FIGS. 7A-7F, the stack may then be diced, then source and detector are bonded to the final chips. If tunability is needed, piezo-electric devices can be bonded over one or more of the cavities. Either of these cavity fabrication methods can be used to easily replicate a plurality of voids or apertures on a single substrate, as shown in FIGS. 7A-7F. Note that each of the voids or apertures can have unique dimensions and thus provide a means to sense multiple gases on a single device. Alternately multiple voids or apertures can provide a means to enhance specificity for a single gas, as described above with respect to FIG. 6.

Method 2

A material such as epoxy can be injection molded and then cured to form cavities. These can be metalized and capped with a metalized epoxy lid wafer, which contains the appropriate ports. Alternatively, the epoxy mold can be created with 3D printing.

Injection molding is well known in the art, and fabrication details are not provided.

Method 3

In another embodiment of the method, a soft metal, such as Al, can be embossed to form cavities. These can be capped with a metalized Al lid wafer, which contains the appropriate ports. This third process may use a malleable material, and may be more suitable for larger structural dimensions, suitable to longer wavelengths (lower frequencies). The photolithographic method outline in method 1 may be capable of making smaller features, and thus higher frequencies.

The third process, shown in FIGS. 8A-8G, and includes FIGS. 8A, 8B, 8C, 8D, 8E, 8F and 8G, and illustrates a process flow which can be used to make the resonant filter using a malleable material, such as aluminum for example, as a starting substrate. Other suitable substrate materials may include gold, zinc, nickel and copper, for example.

FIG. 8A shows the starting substrate 150, which in this case may be an aluminum slab 150. In FIG. 8B, a stamp or mandrel 200 may be brought into contact with the aluminum slab 150. The metal plate (FIG. 8A) of Al may embossed by the hard mandrel 200 to form the cavities on the top side and the bottom side of the metal slab 150. The stamp 200 may be applied to both sides of aluminum slab 150, resulting in the shape shown in FIG. 8C. Upon applying pressure to the stamp 200, the indentations may be made which will create cavities 16, 18, 20 and 22 in the aluminum slab 150. These cavities formed may have a depth on the order of 100-500 um. FIG. 8C shows the resulting topology of the aluminum plate 150, upon stamping with cavities or voids 16, 18, 20, and 22. A hole may be formed to create the aperture 24 between the upper cavity 18 and the lower cavity 16. This hole may be etched or drilled. The situation is as shown in FIG. 8C. If the substrate material 150 is not sufficiently conducting, another metal material may be sputter deposited conformally onto stamped substrate 150.

Following the hole formation, a swage bond of a top and bottom metal plate (FIG. 8D) may be applied to the structure. These metal plates may form conductive layers, 10 and 12. In other embodiments, metal layers may be formed on the outside surface of the aluminum substrate 150. The conductive layer may be for example, gold, or copper, as shown in FIG. 8D. The through holes 11 (input port) and 13 (output port) are shown formed FIG. 8E, for example by etching or drilling. The resonant cavities themselves may also be formed by drilling or machining.

Optionally, the source 36 and detector 34 may then be bonded over the input and output ports (FIG. 8F). In FIG. 8F, a Gunn diode 36 is shown disposed on the top of the structure 150, and adjacent to the through hole 11. A detector 34 may also be disposed on the obverse side, and adjacent to the through hole 13. The Gunn diode 36 may generate the signal that will be launched into input conductor 10, into cavity 22, out to second cavity 18, then into cavity 16, and then into cavity 20, and one through aperture 13 to output conductor 12. The completed aluminum structure is shown in FIG. 8G.

If tunability is required, piezo-electric crystals or films 32 can be bonded over one or more cavities (FIG. 8G).

Method 4

In a fourth method illustrated in FIGS. 9A-9I, a silicon wafer is metalized with a highly conductive noble metal, such as Au. A thick film photoresist may be laminated onto the metalized surface. The photoresist is patterned to open areas for electroplating of noble metal, such as Au. These areas are then electroplated with Au or another noble metal to form the walls of the cavity resonant structures. The resist is then stripped. A lid wafer with metallization and input and output ports is bonded to the tops of these walls. This process is shown in detail in FIG. 9A-9I.

FIG. 9A shows the starting substrate, here the starting substrate material is silicon, 110. In FIG. 9B, the silicon material is etched and then filled with a conductive material to form through substrate vias 120. In the third step shown in FIG. 9C, a seed layer 130 is deposited. In this case, the seed layer 130 may be gold (Au). The seed layer 130 may also be patterned, as shown, by application of photoresist 140, for example, as shown in FIG. 9D.

In FIG. 9E, gold 170 may be plated in areas not covered with photoresist, to form the gold features 170. The photoresist 140 is then stripped from the surface, leaving the gold features 170, as shown in FIG. 9F. This structure is referred to going forward as "subassembly 100". In FIG. 9G, a metallized layer, with an RF aperture 175 formed therein, is pressed against the subassembly 100 and bonded to it. In FIG. 9H, a second subassembly 100' is inverted and place on the structure shown in FIG. 9G. The finished product 1000, shown in FIG. 9I is the mm wave RF cavity described above.

Using any one of these methods, the component is now essentially complete and can be used as set forth above or in the full sensor such as illustrated in FIG. 6. It should be obvious to those skilled in the art that multiple components may be formed on a single substrate as shown in FIGS. 7, 8 and 9. That is, although a single device is shown being fabricated, multiple, photolithographically fabricated devices may be formed at one time.

Accordingly, disclosed here is a mm wave passband filter for a mobile device. The filter may include at least one lithographically fabricated high-Q resonant structure, wherein the resonant structure has at least one cavity formed in a semiconductor substrate, wherein the at least one cavity has a characteristic dimension of about one half of a wavelength in the frequency spectrum of the mm-wave emission source, wherein the at least one cavity is dimensioned to define a resonant structure for at least some frequencies in the frequency spectrum of the mm wave source, and the characteristic dimension is between about 1 mm and 7 mm. The cavity may include a top and a bottom and with sidewalls between the top and the bottom, wherein the sidewalls are not parallel along any dimension.

The filter may include a reflective material covering the top, bottom and sidewalls of the resonator cavities. It may also include a mm wave detector.

The at least one cavity of the mm wave filter may comprise four cavities, wherein all the cavities lie in substantially the same plane. Alternatively, at least one cavity comprises four cavities is configured to have a passband with a width of about 4 GHz and centered at about 28 GHz. At least one cavity may have an aspect ratio (length:width) of at least about 5:1.

The mm wave passband filter may further comprise a top and bottom plate covering the at least one cavity, wherein at least one of the top and bottom plates are deformable, such that the resonant characteristics of the at least one cavity can be tuned. The deformable plates may comprise a bi-morph of Si and PZT.

The at least one cavity may comprise four cavities, which together define a resonant structure, and each mm wave filter may comprise eight resonant structures, each resonant structure comprising the four cavities. The characteristic dimension of the cavity may determine at least one of a width of the passband, the sharpness of the cut off, the out of band rejection.

A method for manufacturing a mm wave passband filter on a substrate is also described. The method may include forming a through substrate feature on at least one substrate using photolithographic methods, wherein the feature has a characteristic dimension, aligning the substrates such that the through substrate feature is registered with the through substrate feature in the adjacent substrates, and bonding the plurality of substrates together form at least one cavity in a substrate stack.

The method may also include forming a lid substrate including an input and an output port, and bonding the lid substrate to a top wafer in the substrate stack. The method may also include depositing a layer of metallization on surfaces of the cavity. Within the method, the characteristic dimension may determine at least one of a width of the passband, the sharpness of the cut off, the out of band rejection. The characteristic dimension may be between about 1 mm and 7 mm.

The at least one cavity may have an aspect ratio (length: width) of at least about 5:1. Within the method, the photolithographic methods may include photoresist deposition, curing, and chemical, plasma or vacuum etching. Forming the cavity may include forming a plurality of cavities, wherein the plurality of cavities are collocated on the semiconductor substrate. Within the method, the at least one cavity may comprise four cavities, and the plurality of resonant structures comprises eight resonant structures, each resonant structure comprising the four cavities.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes a number of fabrication steps and exemplary dimensions for cavity resonant structure, it should be understood that these details are exemplary only, and that the systems and methods disclosed here may be applied to any number of alternative MEMS or non-MEMS devices Accordingly, the exemplary implementations set forth above, are intended to be illustrative, not limiting.

What is claimed is:

1. A mm wave passband filter for a mm-wave emission source, fabricated photolithographically on a substrate, comprising:
   at least one resonant cavity formed in a plurality of substrates, wherein the cavity is formed by registration of voids formed using photolithographic methods in adjacent ones of the plurality of substrates to form a substrate stack, wherein the resonant cavity in the substrate stack has a characteristic dimension of about one half of a wavelength in the frequency spectrum of the mm-wave emission source, wherein the at least one cavity is dimensioned to define a resonant structure for at least some frequencies in the frequency spectrum of the mm wave source, and the characteristic dimension is between 1 mm and 7 mm.

2. The mm wave passband filter of claim 1, further comprising:
   a lid substrate including an input and an output port formed in a lid substrate, wherein the lid substrate is bonded to a top wafer in the substrate stack.

3. The mm wave passband filter of claim 1, further comprising:
   a metallization layer formed on surfaces of the at least one resonant cavity.

4. The mm wave passband filter of claim 1, wherein the characteristic dimension determines at least one of a width of the passband, a sharpness of the cut off, and an amount of out of band rejection.

5. The mm wave passband filter of claim 1, wherein the characteristic dimension is between 1 mm and 7 mm.

6. The mm wave passband filter of claim 1, wherein the at least one cavity has an aspect ratio (length:width) of at least 5:1.

7. The mm wave passband filter of claim 1, wherein the photolithographic methods include photoresist deposition, curing, and chemical, plasma or vacuum etching.

8. The mm wave passband filter of claim 1, wherein the at least one resonant cavity comprises a plurality of resonant cavities, wherein the plurality of resonant cavities are collocated on a semiconductor substrate.

9. The mm wave passband filter of claim 1, wherein the at least one resonant cavity comprises four cavities, and four resonant cavities define a resonant structure, each resonant structure comprising the four resonant cavities and eight resonant structures defining the mm wave passband filter.

10. The mm wave passband filter of claim 1, wherein the resonant cavity comprises a top and a bottom surface and with sidewalls formed by the plurality of substrates between the top and the bottom surfaces, wherein the sidewalls are not parallel along any dimension.

11. The mm wave passband filter of claim 10, further comprising:
   a reflective material deposited over the top surface, the bottom surface and sidewalls of the resonant cavity.

12. The mm wave passband filter of claim 1, wherein forming at least one resonant cavity comprises forming four resonant cavities, wherein all the resonant cavities lie in substantially the same plane.

13. The mm wave passband filter of claim 1, wherein the at least one resonant cavity comprises four resonant cavities configured to have a passband with a width of 4 GHz and centered at 28 GHz.

* * * * *